(12) United States Patent
Arguelles-Paneda

(10) Patent No.: US 6,469,520 B1
(45) Date of Patent: Oct. 22, 2002

(54) TESTING ELECTRICAL CIRCUITS

(75) Inventor: Javier Arguelles-Paneda, Oviedo (ES)

(73) Assignee: Koninglijke Philips Electronics N.V., Eindhoven (NL)

(*) Notice: Subject to any disclaimer, the term of this patent is extended or adjusted under 35 U.S.C. 154(b) by 25 days.

(21) Appl. No.: 09/722,813

(22) Filed: Nov. 27, 2000

(30) Foreign Application Priority Data

Nov. 27, 1999 (GB) .............................................. 9927996
Dec. 24, 1999 (GB) .............................................. 9930853

(51) Int. Cl.[7] ............................................. G01R 27/04
(52) U.S. Cl. ...................................... 324/625; 324/638
(58) Field of Search ............................ 324/638, 625, 324/613, 754, 158.1, 537

(56) References Cited

U.S. PATENT DOCUMENTS

| | | | | |
|---|---|---|---|---|
| 4,263,549 A | * | 4/1981 | Toppeto | 324/127 |
| 4,553,098 A | * | 11/1985 | Yoh et al. | 324/433 |
| 4,837,502 A | * | 6/1989 | Ugenti | 324/523 |
| 4,996,488 A | * | 2/1991 | Nave | 324/613 |
| 5,087,884 A | * | 2/1992 | Brannon | 324/523 |
| 5,138,276 A | * | 8/1992 | Marie | 330/252 |
| 5,495,173 A | * | 2/1996 | Bockelman et al. | 324/625 |
| 5,751,153 A | * | 5/1998 | Bockelman | 324/638 |

FOREIGN PATENT DOCUMENTS

EP  0987554 A1  3/2000

* cited by examiner

Primary Examiner—N. Le
Assistant Examiner—T. R. Sundaram
(74) Attorney, Agent, or Firm—Aaron Waxler

(57) ABSTRACT

A fully differential analogue circuit is tested by monitoring the currents in two branches when a common mode signal is applied and indicating correct operation if the two currents are correlated. A part of the circuit (T20,T21,S1,S2,S3,S4) is modified during test and currents through transistors (T20, T21) are monitored by means of a current mirror and current subtractor arrangement (T213,T214,T215,T216). A voltage (VRL) is produced that, with correlation of the currents, will be approximately mid way between the power supply rails and when mis-correlation occurs will tend to one of the supply rails. The voltage (VRL) is applied to a first amplifier (T219,T221) and to a second amplifier (T222,T223) having a different threshold value from the first amplifier. The outputs of the amplifiers will have opposite logic values if the voltage (VRL) lies between their threshold voltages and the EXOR gate 9 will give a logic 1 output indicating proper circuit function.

12 Claims, 5 Drawing Sheets

TESTING ELECTRICAL CIRCUITS

BACKGROUND OF THE INVENTION

The invention relates to a method of and apparatus for testing fully differential electrical circuits, to a method of designing such circuits, and to circuits designed by such a method. The invention may be applied to both analogue and digital circuits.

Various analogue design-for-testability and built-in self-test schemes have recently been proposed in the literature. Most of them are based on analogue scan paths, to provide observability of circuit internal nodes. Others use digital to analogue and analogue to digital converters to test the analogue functions from the digital part of the integrated circuit. Some proposals use internal monitors to observe whether relevant analogue parameters are within its tolerance window.

Due to their structure fully differential circuits are inherently redundant circuits. Some self-testing proposals have been made that are based on this property. Those test strategies are based on observing the balance of differential voltage signals at the output of each block in the circuit. The differential voltage signals are transformed into a single ended code that is analysed using a window comparator (checker). An error signal is generated when a code falls outside the valid code space.

SUMMARY OF THE INVENTION

It is an object of the invention to enable the provision of a method of and an apparatus for testing fully differential electrical circuits which is comparatively inexpensive to implement.

It is a further object of the invention to enable the provision of a method of designing fully differential electrical circuits which facilitates testing of the circuit designed.

The invention provides a method of testing a fully differential analogue circuit comprising the steps of exciting the circuit with a common mode signal, monitoring two symmetrical branch current signals resulting from the common mode excitation signal, and providing an indication of whether the two branch current signals are correlated.

The invention is based on the realisation that when a fully differential circuit is excited with an input stimulus that is a pure common mode input signal, i.e. no differential mode signal is applied, the circuit response is a common mode output signal as well, and a proper correlation of two branch currents in the symmetrical structure of the circuit is observed.

Each of the branch currents in the symmetrical structure of the fully differential circuit depends on: the common mode input signal, the differential mode input signal, the circuit topology and the bias conditions. Therefore, due to inherent properties of fully differential circuits, when no differential mode input signal is applied both branch currents in the symmetrical structure should be correlated. However, any defect due, for example to the fabrication process that affects the topology of the fully differential circuit, will lead to a mis-correlation of those branch currents, whether in their quiescent component or in their dynamic component.

The indication as to whether the two branch signals are correlated may conveniently be in digital form.

The method may further comprise the steps of:
i) sampling each branch current,
ii) subtracting the sampled current and producing a voltage representing the subtracted currents,
iii) applying the voltage produced in step ii) to a first arrangement to generate a logic 1 when the voltage is equal to or lower than a given value and a logic 0 when the voltage is higher than the given value,
iv) applying the voltage produced in step ii) to a second arrangement to generate a logic 0 when the voltage is equal to or higher than the given value and a logic 1 when the voltage is lower than the given value,
v) exclusively ORing the outputs of the first and second arrangements, and
vi) indicating correlation in dependence on the result of the exclusive ORing.

The given value may be a band of values.

This enables process tolerances to be taken into account so that the monitored currents in the two branches are approximately equal, the permissible deviation between the two currents being defined by the magnitude of the band. It will be appreciated that strict equality of the two branch currents, particularly in the case of analogue circuitry, is unlikely to be achieved due to normal circuit tolerances. Consequently, correct operation of the circuit can be indicated provided that the two currents are correlated within a given tolerance.

The first and second arrangements may be amplifiers having different threshold values.

This provides a convenient method of setting a band of values. The magnitude of the band, or the permitted tolerance, will depend on the difference between the threshold values.

The invention further provides an integrated circuit including a fully differential circuit, the integrated circuit comprising a monitor circuit, said monitor circuit comprising means for sampling currents in symmetrical branches of the differential circuit, means for subtracting the sampled currents and producing an output voltage representing the subtracted currents, a first arrangement for generating a logic 1 when the voltage is equal to or lower than a given value and a logic 0 when the voltage is higher than the given value, a second arrangement for generating a logic 0 when the voltage is equal to or higher than the given value and a logic 1 when the voltage is lower than the given value, an exclusive ORgate having inputs to which the outputs of the first and second arrangements are applied, and an output indicating whether the differential circuit is faulty connected to the output of the exclusive ORgate.

In this way an integrated circuit containing a fully differential circuit can be provided with a self test facility for the fully differential part. This can provide a simplification in the testing of such circuits. That is, by selecting an appropriate part of a circuit and reconfiguring it for test purposes and then monitoring and analysing the branch currents at that part of the circuit the correct functioning of the circuit can be tested for without requiring external test equipment or access to the internal circuitry apart from being able to control the reconfiguration and access the results of the correlation.

The given value may be a band of values. The first and second arrangements may be amplifiers having different threshold values.

This gives a convenient way of achieving a suitable tolerancing of the testing for equality which can take into account normal process variations.

The invention further provides a method of designing for testability fully differential electrical circuits including a test structure comprising the steps of:
i) designing a fully differential circuit to perform a desired function, ii) selecting one or more parts of the circuit that pass symmetrical currents when a common mode signal is applied to the input of the circuit when the circuit is fault free, iii) providing switching means for causing said one or more parts to adopt a first configuration to enable the branch currents to be monitored for test purposes and a second configuration for normal circuit operation, and iv) providing monitoring means for monitoring the branch currents when said one or more parts adopt the first configuration.

This enables the testability of the circuit to be enhanced by providing the means to modify the circuit to perform the test function using the inherent properties of fully differential circuits. Thus, by reconfiguring part of the circuit to enable the branch currents to be monitored, and including a monitoring circuit to enable the branch currents to be monitored and checked for correlation, it becomes possible to detect faults caused during the manufacture of the circuit that affect the circuit topology. The selection of the parts may be carried out using a node impedance analysis to maximise the effect observed.

The invention still further provides a fully differential electrical circuit comprising a monitoring circuit for monitoring the currents in symmetrical branches of the circuit when excited by a common mode input signal, switching means for modifying a part of the circuit for test purposes to enable the current monitoring to take place and to restore said part of the circuit to its normal circuit function at other times, and test means for determining whether the currents in the symmetrical branches are substantially equal under test conditions.

Thus, as manufactured the circuit includes the means for checking its functionality. By applying a common mode signal to its input and activating the test function the circuit is modified to enable symmetrical branch currents to be monitored and their correlation can be used to indicate correct circuit topology. This simplifies the testing of integrated circuits, which with their increasing complexity are becoming more expensive to test to ensure their functionality.

BRIEF DESCRIPTION OF THE DRAWING

The above and other features and advantages of the invention will become apparent from the following description, by way of example, of an embodiment of the invention with reference to the accompanying drawings, in which.

DESCRIPTION OF THE PREFERRED EMBODIMENTS

Figure 1:
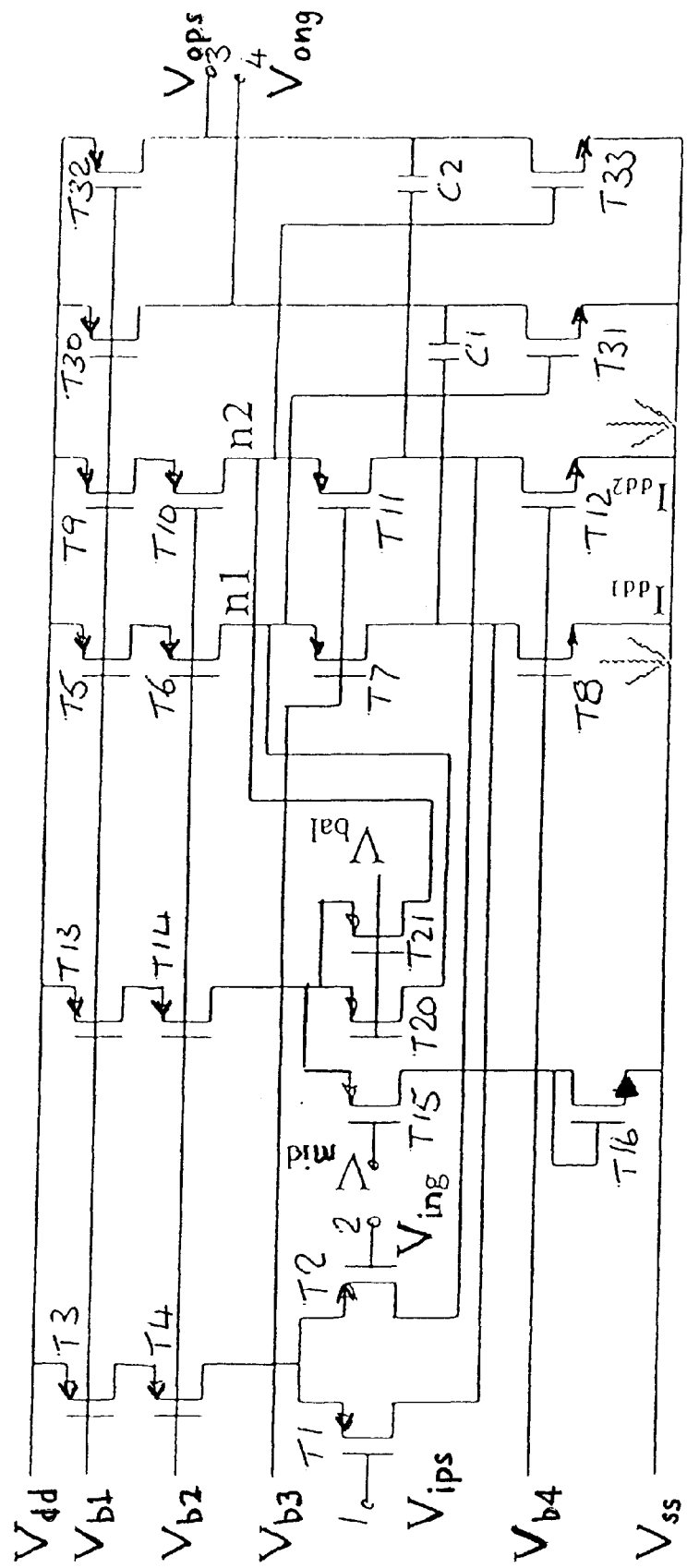
FIG. 1 shows a differential amplifier to which the method of testing according to the invention may be applied.

FIG. 1 is a schematic circuit diagram of a differential amplifier having inputs 1 and 2 to which input signals Vips and Ving are applied. The inputs 1 and 2 are fed to a differential pair of transistors T1 and T2 whose tail current is defined by transistors T3 and T4 and bias voltages $V_{b1}$ and $V_{b2}$. Two chains of transistors T5, T6, T7, T8 and T9, T10, T11, T12 are connected between the supply rails $V_{dd}$ and $V_{ss}$, the transistors of each chain being fed with bias voltages $V_{b1}$, $V_{b2}$, $V_{b3}$ and $V_{b4}$, respectively. The drain contacts of transistors T1 and T2 are connected to the drain contacts of transistors T8 and T12 respectively.

A further differential pair of transistors T20 and T21 have a tail current defined by transistors T13 and T14 and bias voltages $V_{b1}$ and $V_{b2}$ and have a bias voltage $V_{bal}$ applied to their gate contacts. The outputs of the further differential pair are fed to the junctions of transistors T6 and T7 and transistors T10 and T11.

A differential output stage is provided comprising the series arrangement of transistors T30 and T31 from the junction of which a first output signal $V_{ong}$ is derived and fed to an output 3 and the series arrangement of transistors T32 and T33 from the junction of which a second output signal $V_{ops}$ is derived and fed to an output 4. It will be apparent that the differential input signal is formed by $V_{ips}$ and $V_{ing}$ and that the differential output signal is formed by $V_{ops}$ and $V_{ong}$. The junction of transistors T7 and T8 is connected via a capacitor C1 to the junction of transistors T30 and T31, while the junction of transistors T11 and T12 is connected via a capacitor C2 to the junction of transistors T32 and T33. The series arrangement of transistor T15 and a diode connected transistor T16 is connected between the tail of the further differential pair and the supply rail $V_{ss}$. A control signal $V_{mid}$ which is a feedback signal derived from the output of the amplifier is connected to the gate contact of transistor T15. The amplifier shown in FIG. 1 is an example of a fully differential circuit in which the method of the present invention may be formed and into which a monitoring circuit according to the invention may be inserted. The particular form and operation of the amplifier is not part of the current invention and consequently will not be further described herein except in that the responses shown in FIGS. 3 to 5 derive from this particular circuit. It should further be appreciated that although the amplifier described with reference to FIG. 1 is an analogue circuit the invention is not limited to analogue circuits but may be applied to any fully differential circuit.

Figure 2:
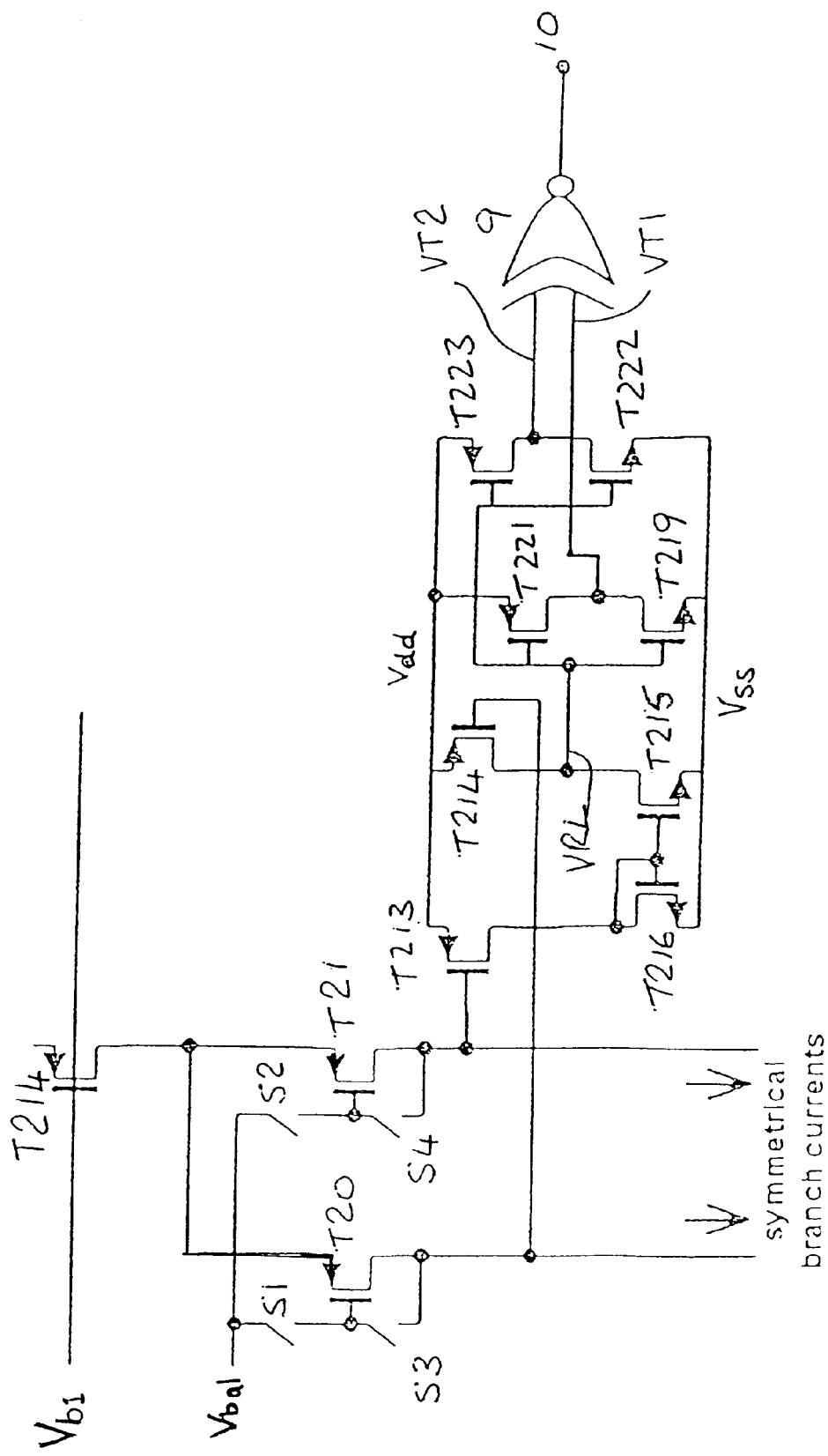
FIG. 2 shows an on chip monitor for monitoring branch current.

FIG. 2 is a schematic circuit diagram of a monitor for determining whether currents in the two symmetrical branches of a differential circuit are equal and shows how such a monitor may be implemented in the amplifier of FIG. 1.

The transistors T20 and T21 of FIG. 1 have switches S1 and S2 inserted between their gate contacts and the bias source $V_{bal}$. They have further switches S3 and S4 inserted between their gate and drain contacts. During normal operation of the amplifier the switches S1 and S2 are closed and switches S3 and S4 are open and during the test process the switches S1 and S2 are open and switches S3 and S4 are closed. The operation of these switches is controlled by means of a signal applied to the circuit when the test process is invoked. During the test process inputs 1 and 2 are excited by a common mode signal, which means that if the circuit is operating correctly the currents in the symmetrical branches will be equal. In particular, the currents through transistors T20 and T21, which are now configured as non-linear resistors, will be equal, within normal circuit tolerances.

The drain currents through transistors T20 and T21 are mirrored by transistors T213 and T214 and subtracted using the current mirror formed by transistors T215 and T216 to produce a resulting output voltage VRL which is applied to the gate contacts of a pair of transistors T219 and T221 connected across the supply rails $V_{dd}$ and $V_{ss}$ to form a first amplifier and to the gate contactss of a further pair of transistors T222 and T223 which are also connected across the supply rails $V_{dd}$ and $V_{ss}$ to form a second amplifier. The outputs of the first and second amplifiers are fed to respective inputs of an EXORgate 9 the state of whose output 10 will give an indication of whether the circuit is faulty.

In operation, if the currents in the two branches are equal then the voltage at the junction of transistors T214 and T215, that is VRL, will be equal to half the supply voltage and the first amplifier formed by transistors T219 and T221 is designed to produce a logic 1 output when VRL has that value. The second amplifier formed by transistors T222 and T223 is designed to produce a logic 0 output when VRL has that value. In order to enable some tolerances for normal process variations the switching thresholds of the first and second amplifiers can be set by appropriate dimensioning of transistors T219, T221, T222, and T223 and provided that VRL lies between these threshold values (which may be regarded as the given value) then the output of the first amplifier will be a logic 1 and that of the second amplifier a logic 0.

If the value of VRL lies outside the band of values defined by the threshold voltages of the first and second amplifiers then both of them will produce the same output, that is a logic 1 whenever VRL is below that value and a logic 0 whenever VRL is above that value.

As the outputs of the first and second amplifiers are fed to an exclusive ORgate it can be seen that a logic 1 output from the exclusive ORgate will signify that the circuit passes the test.

The operation may be summarised as on-chip monitor consisting of the following functional steps:

1) To reconfigure the circuit under test to take a sample of each symmetrical branch current. (by opening switches S1 and S2 and closing switches S3 and S4);
2) To amplify and subtract those current samples, (in the circuit comprising transistors T213, T214, T215 and T216);
3) To amplify the resulting signal from step 2 to generate a logic 1 whenever it is equal or lower than the mid point of the supply voltages, and a logic 0 if higher than the mid point of the supply voltages. (In the amplifier comprising transistors T219 and T221);
4) To amplify the resulting signal from step 2 to generate a logic 0 whenever it is equal or higher than the mid point of the supply voltages, and a logic 1 if lower than the mid point of the supply voltages. (In the amplifier comprising transistors T222 and T223); and
5) To make the EXOR logic operation of the resulting signal from amplifiers described in steps 3 and 4 (in EXORgate 9).

In the monitor shown in FIG. 2 the voltage VRL will be at an intermediate value (nominally half the supply voltage) when the two currents are correlated and will tend to one of the supply rails when mis-correlation occurs depending on the sign of the mis-correlation monitored.

Figure 3:
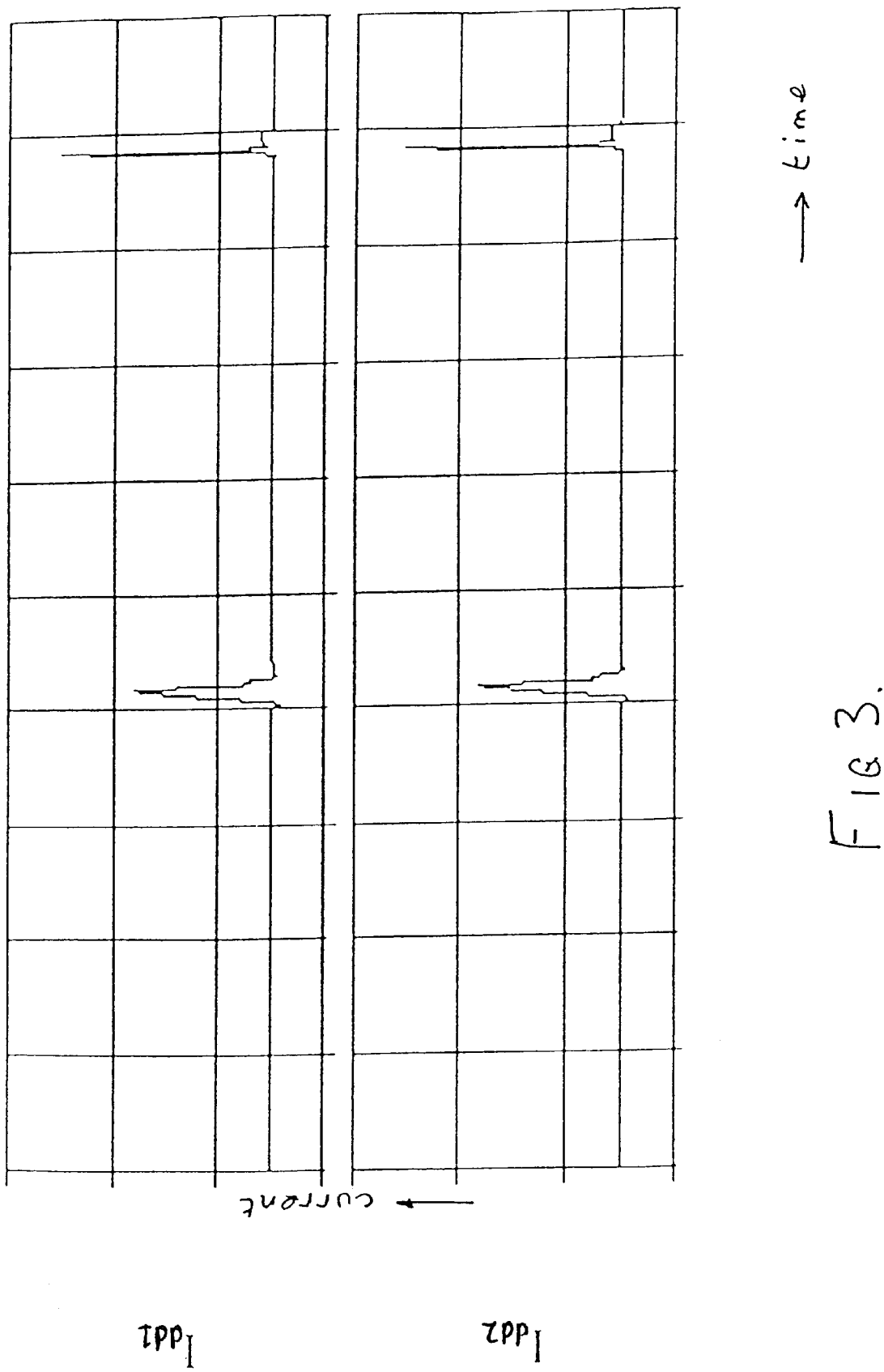
FIG. 3 shows symmetrical branch currents measured in a fault free circuit.
Figure 4:
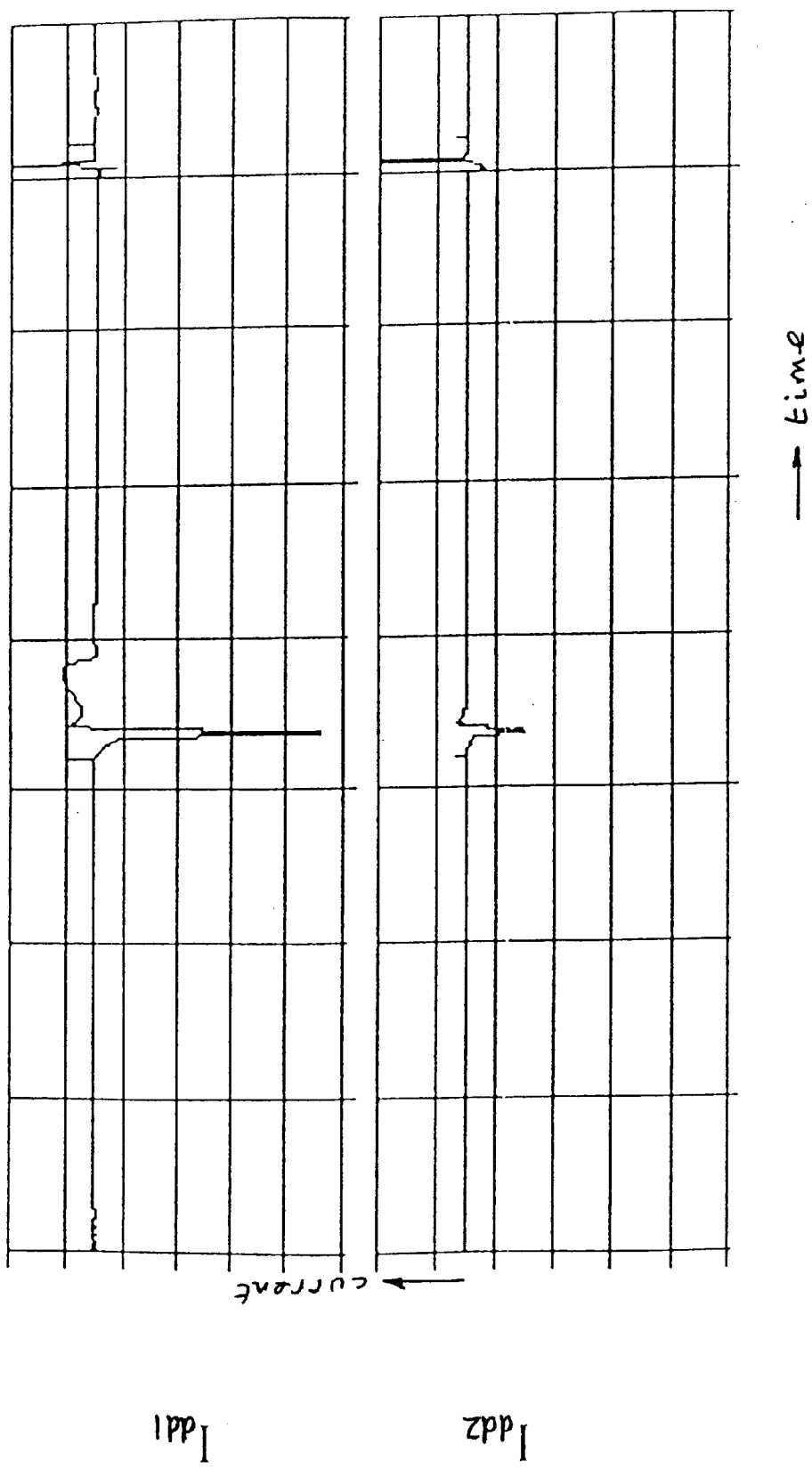
FIG. 4 shows symmetrical branch currents measured in a faulty circuit.

A number of simulations have been carried out to investigate the effect upon those branch currents of different defects that may occur in a microelectronic implementation of the circuit shown in FIG. 1. Results show that a mis-correlation may occur either in the quiescent level and/or in the transient behaviour of the branch currents. FIG. 3 shows simulation results for a fault free circuit. FIG. 4 shows the simulation result for a fault that produce a mis-correlation in the transient spikes of the branch currents.

Figure 5:
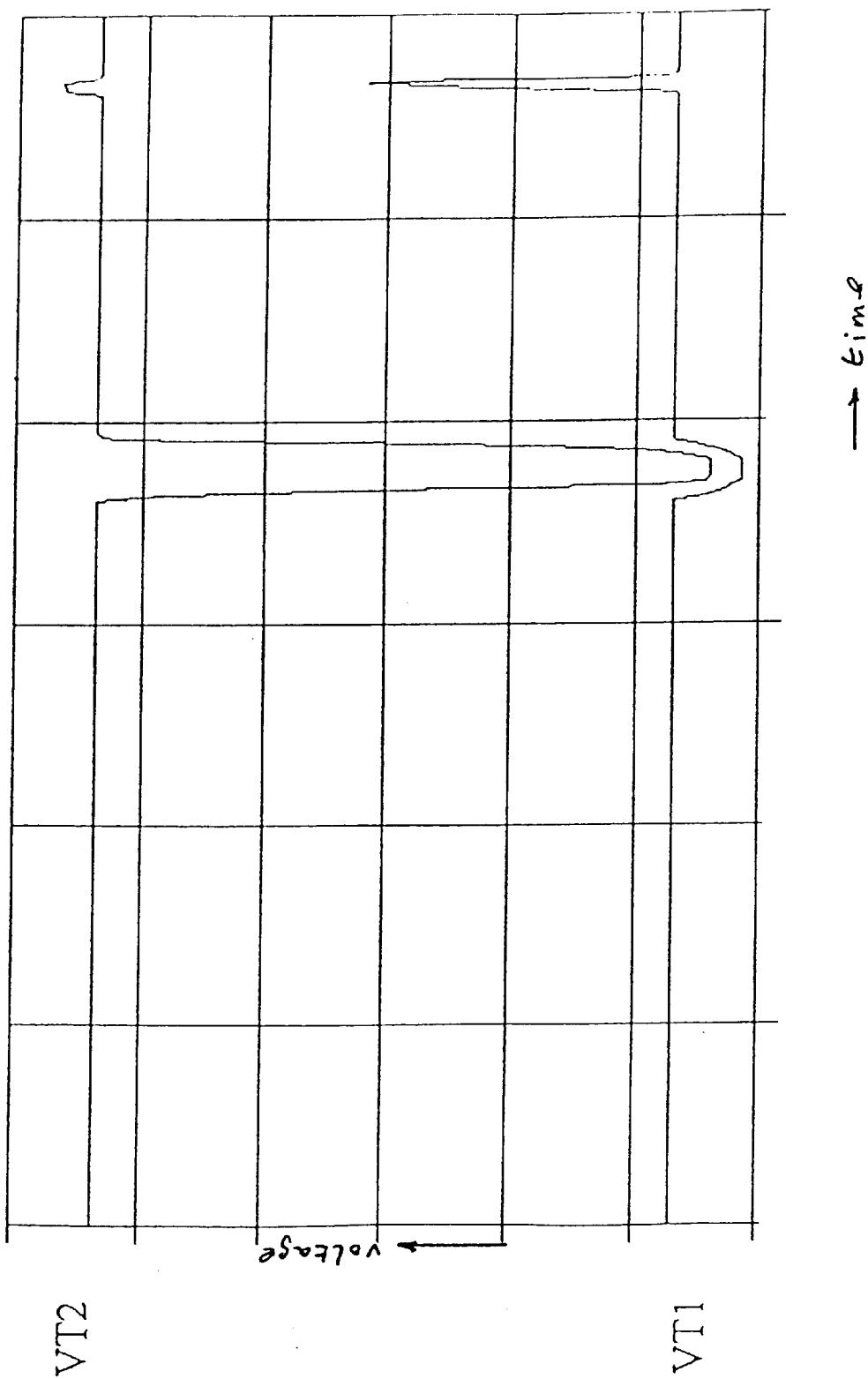
FIG. 5 shows the output signals VT1 and VT2 from the branch current monitor.

FIG. 5 shows the branch current monitor output signals VT1 and VT2, from the first and second amplifiers that are EXORed to generate the digital test signature. That is the signals VT1 and VT2 are the signals applied to the inputs of the EXOR gate 9. These signals correspond to the same fault simulated to generate the currents shown in FIG. 4. From FIG. 4 and FIG. 5 it can be observed how the difference in the first transient spike is big enough to excite an error output code from the branch current monitor. However, the difference in the second transient spike, although it exists, is not large enough to produce a clear digital output level in VT1. The quiescent behaviour of the branch currents, Idd1 and Idd2, although modified by the fault, does not exhibit any mis-correlation, nor produce any effect on the common mode output voltage. The transient behaviour of these currents is, however, clearly different and a dynamic mis-correlation will occur which can be monitored by the arrangement described with reference to FIG. 2.

The branch current monitor shown in FIG. 2 is tolerant to normal process variations, i.e. test intermediate outputs VT1 and VT2 allow for a variation margin in VRL larger than ±140 mV before giving an error output code. That is the given value has a band of values of ±140 mV about the given value, which in this case is the supply voltage/2. The variation of this signal due to normal process fluctuation in this particular circuit has been measured to be up to ±70 mV.

It will be clear that the particular circuit shown is purely by way of example and the present invention can be applied to any fully differential circuit and is not limited either to the particular type of circuit shown or to analogue circuits in general. It may also be applied to digital circuits which are of fully differential form. It will also be apparent that a VLSI implementation may include a plurality of functional circuits, some or all of which may be designed to include a test facility of this form.

A method of designing fully differential electrical circuits according to the invention comprising the steps of:

i) designing a fully differential circuit to perform a desired function, such as the amplifier shown in FIG. 1;
ii) selecting one or more parts of the circuit that pass symmetrical currents when a common mode signal is applied to the input of the circuit when the circuit is fault free, that is in this particular case the transistors T20 and T21;
iii) providing switching means for causing said one or more parts to adopt a first configuration to enable the branch currents to be monitored for test purposes and a second configuration for normal circuit operation, that is the switches S1 to S4; and
iv) providing monitoring means for monitoring the branch currents when said one or more parts adopt the first configuration, that is the current mirroring and subtraction arrangement T213 to T216, the first amplifier T219 and T221, the second amplifier T222 and T223, and the EXOR gate 9.

Thus the design methodology uses the property of fully differential circuits that when excited by common mode signals equal currents flow in symmetrical branches and selects nodes where these currents can be monitored. A monitoring circuit is built in which can monitor these symmetrical currents under test conditions and indicate whether correlation exists under both quiescent and transient conditions.

A fully differential electrical circuit according to the invention may comprise a monitoring circuit for monitoring the currents in symmetrical branches of the circuit when excited by a common mode input signal, that is transistors T213 to T216. Switching means, that is switches S1 to S4, are provided for modifying a part of the circuit, that is transistors T20 and T21, for test purposes to enable the current monitoring to take place and to restore said part of the circuit to its normal circuit function at other times. Test means are provided for determining whether the currents in the symmetrical branches are substantially equal under test conditions, that is amplifiers T219 and T221 and T222 and T223 and EXOR gate 9.

From reading the present disclosure, other modifications will be apparent to persons skilled in the art. Such modifications may involve other features which are already known in the design and use of electrical circuits and methods of testing thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A method of testing a fully differential circuit comprising the steps of exciting the circuit with only a common mode signal, monitoring two symmetrical branch signals resulting from the common mode excitation signal, and providing an indication of whether the two branch signals are correlated.

2. A method as claimed in claim 1 further comprising the steps of:
   i) sampling each branch current,
   ii) subtracting the sampled current and producing a voltage representing the subtracted currents,
   iii) applying the voltage produced in step ii) to a first arrangement to generate a logic 1 when the voltage is equal to or lower than a given value and a logic 0 when the voltage is higher than the given value,
   iv) applying the voltage produced in step ii) to a second arrangement to generate a logic 0 when the voltage is equal to or higher than the given value and a logic 1 when the voltage is lower than the given value,
   v) exclusively ORing the outputs of the first and second arrangements, and
   vi) indicating correlation in dependence on the result of the exclusive ORing.

3. A method as claimed in claim 2 in which the given value is a band of values, said band depending on the difference between an threshold value of the first arrangement and a threshold value of the second arrangement.

4. A method as claimed in claim 3 in which the first and second arrangements are amplifiers having different threshold values.

5. A method as claimed in claim 1 in which the fully differential circuit is an analog circuit.

6. An integrated circuit including a fully differential circuit, the integrated circuit comprising a monitor circuit, said monitor circuit comprising means for sampling currents in symmetrical branches of the differential circuit, means for subtracting the sampled currents and producing an output voltage representing the subtracted currents, a first arrangement for generating a logic 1 when the voltage is equal or lower than a given value and a logic 0 when the voltage is higher than the given value, a second arrangement for generating a logic 0 when the voltage is equal to or higher than the given value and a logic 1 when the voltage is lower than the given value, an exclusive ORgate having inputs to which the outputs of the first and second arrangements are applied, and an output indicating whether the differential circuit is faulty connected to the output of the exclusive ORgate.

7. An integrated circuit as claimed in claim 6 in which the given value is a band of values, said band depending on the difference between an threshold value of the first arrangement and a threshold value of the second arrangement.

8. An integrated circuit as claimed in claim 6 in which the first and second arrangements are amplifiers having different threshold values.

9. An integrated circuit as claimed in claim 6 which includes a fully differential analog circuit.

10. A method of designing for testability fully differential electrical circuits including a test structure comprising the steps of:
   i) designing a fully differential circuit to perform a desired function,
   ii) selecting one or more parts of the circuit that pass symmetrical currents when the input of the circuit is excited by a common mode signal when the circuit is fault free,
   iii) providing switching means for causing said one or more parts to adopt a first configuration to enable the branch currents to be monitored for test purposes and a second configuration for normal circuit operation, and
   iv) providing monitoring means for monitoring the branch currents when said one or more parts adopt the first configuration.

11. A fully differential electrical circuit comprising a monitoring circuit for monitoring the currents in symmetrical branches of the circuit when excited by a common mode input signal, switching means for modifying a part of the circuit for test purposes to enable the current monitoring to take place and to restore said part of the circuit to its normal circuit function at other times, and test means for determining whether the currents in the symmetrical branches are substantially equal under test conditions.

12. A fully differential electrical circuit designed by a method as claimed in claim 10.

* * * * *